US010128109B2

(12) United States Patent
Cannara et al.

(10) Patent No.: US 10,128,109 B2
(45) Date of Patent: Nov. 13, 2018

(54) METHOD FOR SYNTHESIS OF TWO-DIMENSIONAL DICHALCOGENIDE SEMICONDUCTORS

(71) Applicant: Elwha LLC, Bellevue, WA (US)

(72) Inventors: Rachel Cannara, Kirkland, WA (US); Emma Rae Mullen, Seattle, WA (US); Fred Sharifi, Kirkland, WA (US)

(73) Assignee: Elwha LLC, Bellevue, WA (US)

( * ) Notice: Subject to any disclaimer, the term of this patent is extended or adjusted under 35 U.S.C. 154(b) by 63 days.

(21) Appl. No.: 15/204,875

(22) Filed: Jul. 7, 2016

(65) Prior Publication Data

US 2017/0011915 A1  Jan. 12, 2017

Related U.S. Application Data

(60) Provisional application No. 62/190,503, filed on Jul. 9, 2015.

(51) Int. Cl.
| | |
|---|---|
| *C30B 29/46* | (2006.01) |
| *H01L 21/02* | (2006.01) |
| *G01B 7/06* | (2006.01) |
| *H01L 21/66* | (2006.01) |

(52) U.S. Cl.
CPC ........ *H01L 21/02568* (2013.01); *G01B 7/066* (2013.01); *H01L 21/02381* (2013.01); *H01L 21/02433* (2013.01); *H01L 21/02614* (2013.01); *H01L 21/02389* (2013.01); *H01L 21/02395* (2013.01); *H01L 21/02414* (2013.01); *H01L 22/12* (2013.01); *H01L 22/26* (2013.01)

(58) Field of Classification Search
CPC ......... C30B 29/46; C30B 25/02; C30B 25/08; C30B 25/10
See application file for complete search history.

(56) References Cited

U.S. PATENT DOCUMENTS 9,608,101 B2 * 3/2017 Kis ................... H01L 29/66742

FOREIGN PATENT DOCUMENTS

WO  WO 2015/091781 A2  6/2015

OTHER PUBLICATIONS

PCT International Search Report; International App. No. PCT/US2016/041479; dated Oct. 21, 2016; pp. 1-3.
Ji et al.; "Chemical vapour deposition of group-VIB metal dichalcogenide monolayers: engineered substrates from amorphous to single crystalline"; Chemical Society Reviews; Sep. 26, 2014; pp. 2587-2600; vol. 44; The Royal Society of Chemistry.
(Continued)

*Primary Examiner* — Robert M Kunemund (57) ABSTRACT

The present disclosure relates to methods of making a transition metal dichalcogenide. The methods can include a step of depositing a transition metal onto a substrate to form an epitaxial transition metal layer. The methods can also include a step of depositing a chalcogen onto the epitaxial transition metal layer, and a step of reacting the chalcogen with the epitaxial transition metal layer to form a transition metal dichalcogenide. In some instances, the chalcogen is reacted with the epitaxial transition metal layer at a temperature of between about 300° C. and 600° C., between about 300° C. and 550° C., between about 300° C. and 500° C., between about 300° C. and 450° C., or between about 300° C. and 400° C.

34 Claims, 7 Drawing Sheets

(56) References Cited

OTHER PUBLICATIONS

Wang, H., et al., Integrated Circuits Based on Bilayer MoS(2) Transistors, *Nano Letters*, 12, (2012).
Domenichini, B., et al., Epitaxial growth of molybdenum on TiO2(110), *Surface Science*, 544, (2003).
Bloch, J., Heiblum, M., & Komem, Y. Growth of molybdenum and tungsten on GaAs in a molecular beam epitaxy system, *Applied Physics Letters*, 46 (11), (1985).
Romero, G., Johnson, A. T. C., Biosensors, A. (n.d.). Nickel Chloride-Mediated Protein Attachment to Molybdenum Disulfide for Biosensing Applications, 1-9.
Zhang, Y. J.,et al., Light-Emitting Transistor, 344, (2014).
Najmaei, S., et al., Vapour phase growth and grain boundary structure of molybdenum disulphide atomic layers. *Nature Materials*, 12, 754, (2013).
Ma, L., Nath, et al., Epitaxial growth of large area single-crystalline few-layer $MoS_2$ with high space charge mobility. *Applied Physics Letters*, 105, 072105 (2014).
Qingqing Ji, et al., "Epitaxial Monolayer MoS2 on Mica with Novel Photoluminescence," American Chemical Society, Nano Letters, pp. 3870-3877 (2013).

* cited by examiner

METHOD FOR SYNTHESIS OF TWO-DIMENSIONAL DICHALCOGENIDE SEMICONDUCTORS

PRIORITY APPLICATIONS

The present application claims benefit of priority of U.S. Provisional Patent Application No. 62/190,503 entitled METHOD FOR SYNTHESIS OF TWO-DIMENSIONAL DICHALCOGENIDE SEMICONDUCTORS, naming RACHEL CANNARA, EMMA RAE MULLEN, AND FRED SHARIFI as inventors, filed 9 Jul. 2015, which was filed within the twelve months preceding the filing date of the present application or is an application of which a currently co-pending priority application is entitled to the benefit of the filing date.

If an Application Data Sheet ("ADS") has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications, or claims benefits under 35 U.S.C. § 119(e) for provisional patent applications, for any and all parent, grandparent, great-grandparent, etc. applications of the Priority Application(s)).

If the listings of applications provided above are inconsistent with the listings provided via an ADS, it is the intent of the Applicant(s) to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

TECHNICAL FIELD

The present disclosure relates to methods for making transition metal dichalcogenide semiconductor structures.

SUMMARY

The present disclosure relates to methods of making transition metal dichalcogenide semiconductor structures, such as molybdenum disulfide and tungsten diselenide. In some embodiments, the methods employ vapor phase deposition techniques to deposit a transition metal (e.g., molybdenum, tungsten, etc.) onto a substrate having a crystalline layer to form an epitaxial transition metal layer. The methods can further employ chemical vapor deposition techniques to deposit a chalcogen (e.g., sulfur, selenium, etc.) onto the epitaxial transition metal layer.

The chalcogen can be reacted with the epitaxial transition metal layer to form a transition metal dichalcogenide (e.g., $MoS_2$, $WSe_2$, etc.). In some embodiments, the chalcogen is reacted with the epitaxial transition metal layer at a temperature of between about 300° C. and 600° C., between about 300° C. and 550° C., between about 300° C. and 500° C., between about 300° C. and 450° C., or between about 300° C. and 400° C. In other embodiments, the chalcogen is reacted with the epitaxial transition metal layer at a temperature of less than about 600° C., less than about 550° C., less than about 500° C., less than about 450° C., less than about 400° C., or less than about 350° C.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The written disclosure herein describes illustrative embodiments that are non-limiting and non-exhaustive. Reference is made to certain of such illustrative embodiments that are depicted in the figures, in which.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Thus, the following detailed description of the embodiments of the methods of the disclosure is not intended to limit the scope of the disclosure, as claimed, but is merely representative of possible embodiments. In addition, the steps of a method do not necessarily need to be executed in any specific order, or even sequentially, nor do the steps need to be executed only once.

The present disclosure relates to methods for making or manufacturing transition metal dichalcogenides (TMDs). The transition metal dichalcogenides, which can also be referred to as transition metal dichalcogenide semiconductors or two-dimensional transition metal dichalcogenide structures, can be used in various technologies, including, but not limited to, microelectronics, optoelectronics, and bio/chemical sensing (e.g., bio-sensing, chemical sensing, gas sensing, etc.). The methods disclosed herein can be advantageous in many ways, and can be used to overcome and/or alleviate many problems associated with prior known manufacturing techniques, which can be difficult, inefficient, and/or unreliable.

Figure 1:
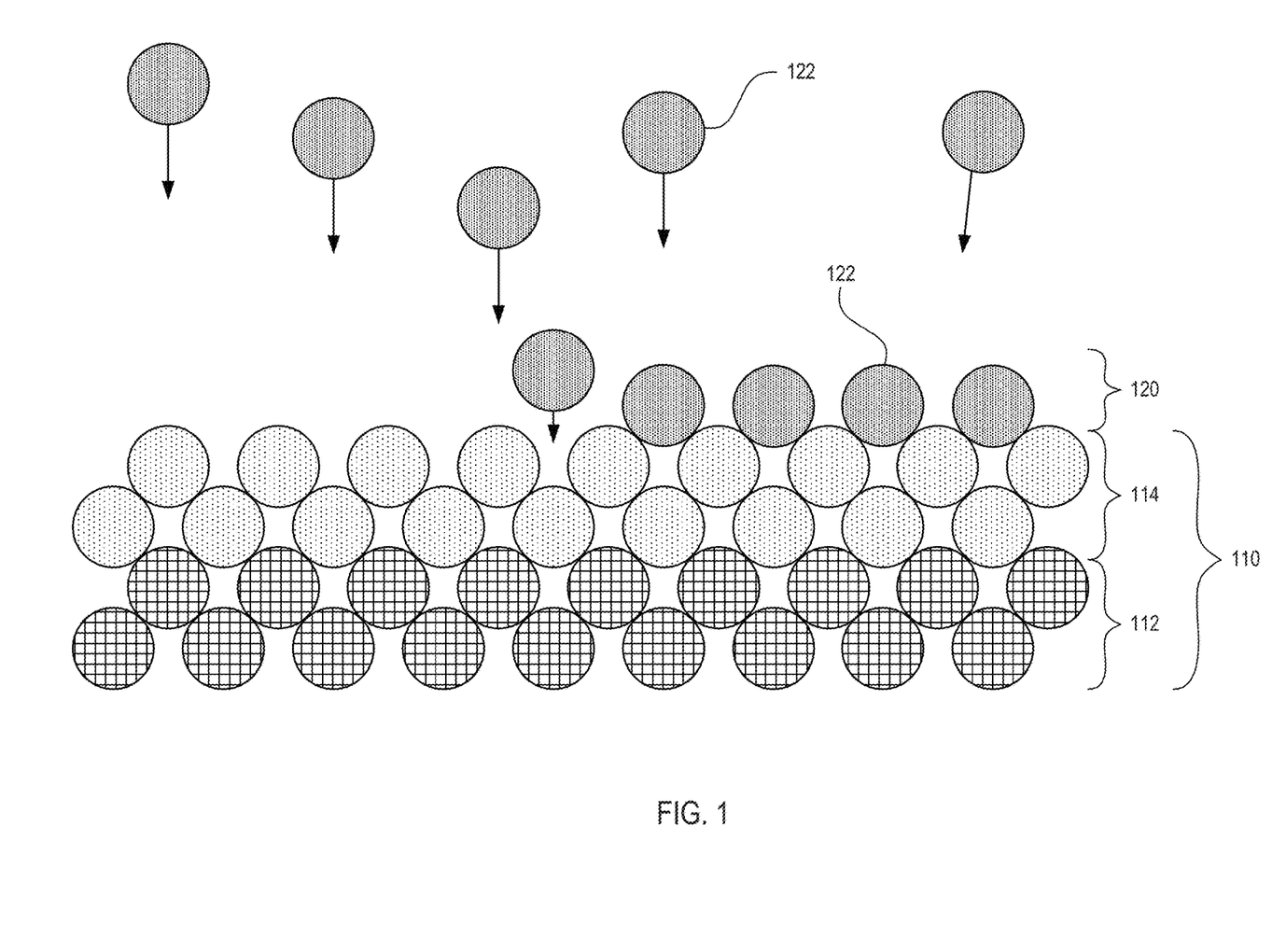
FIG. 1 is a schematic illustration of a method of depositing a transition metal onto a substrate in accordance with an embodiment of the present disclosure.
Figure 2:
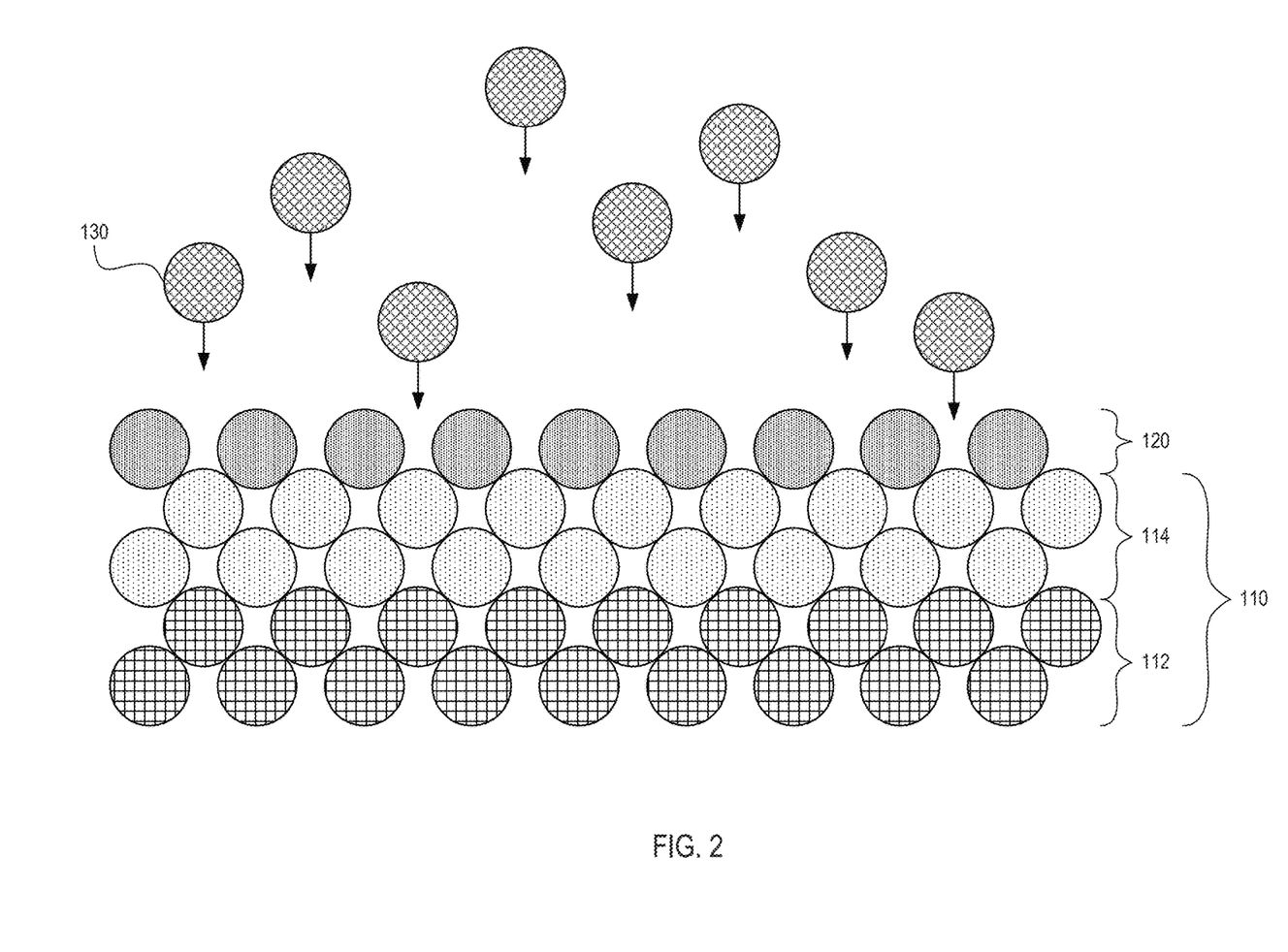
FIG. 2 is a schematic illustration of a method of depositing a chalcogen onto an epitaxial transition metal layer in accordance with an embodiment of the present disclosure.
Figure 3:
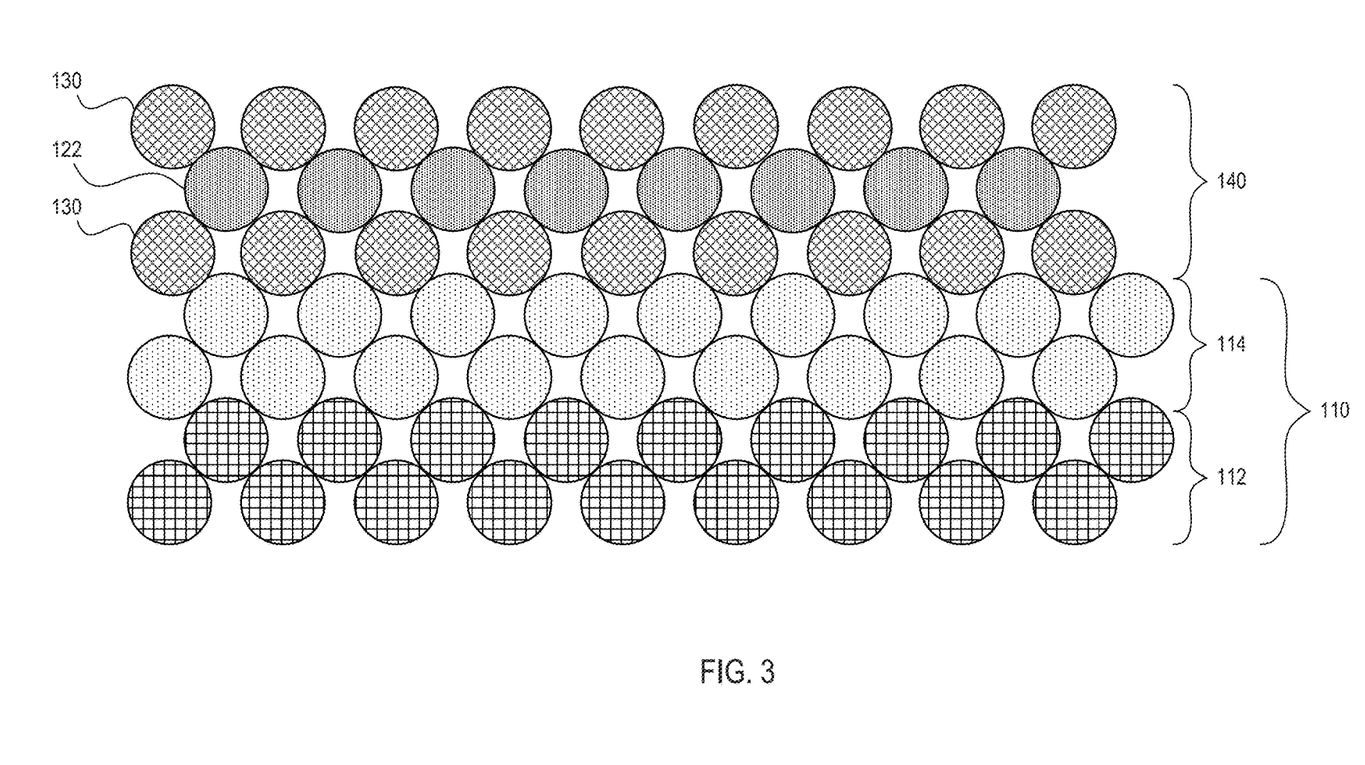
FIG. 3 is a schematic illustration of a transition metal dichalcogenide formed in accordance with an embodiment of the present disclosure.

FIGS. 1-3 depict an illustrative method of making or manufacturing a transition metal dichalcogenide 140 in accordance with an embodiment of the present disclosure. In particular, FIG. 1 depicts a schematic view of a step of depositing a transition metal 122 onto a substrate 110, FIG. 2 depicts a schematic view of a step of depositing a chalcogen 130 onto an epitaxial transition metal layer 120, and FIG. 3 depicts a schematic view of a transition metal dichalcogenide 140 formed after reacting the chalcogen 130 with the epitaxial transition metal layer 120 in accordance with the methods disclosed herein. It will be appreciated that FIGS. 1-3 are schematic illustrations only and are not intended to be limiting in any way.

As shown in FIG. 1, the methods of making a transition metal dichalcogenide disclosed herein can comprise a step of depositing a transition metal 122 onto a substrate 110 to form a layer 120 of transition metal. In some embodiments, this transition metal layer 120 can be arranged in an ordered or substantially ordered manner and can be referred to as an epitaxial transition metal layer 120 (or an epitaxial layer), as detailed below. As can be appreciated, the terms manufacturing, fabricating, forming, etc. can also be used to describe the process (or a step thereof) of making the transition metal dichalcogenide.

Various deposition techniques and/or processes can be used for the depositing steps disclosed herein, including vapor phase deposition techniques and chemical vapor deposition techniques. Without limitation, vapor phase deposition (which can also be referred to as physical vapor deposition) can be used to describe deposition methods that employ physical processes (e.g., heating and/or sputtering) to produce a vapor of material (such as the transition metal material 122 depicted in FIG. 1), which can then be deposited or otherwise coated onto a substrate (such as the substrate 110 depicted in FIG. 1). Without limitation, chemical vapor deposition can be used to describe deposition methods in which the substrate material (e.g., such as layer 120 depicted in FIG. 2) is exposed to a precursor material (such as the chalcogen material 130 depicted in FIG. 2), which reacts with and/or decomposes on the substrate to produce the desired deposit or coating (such as the layer 140 depicted in FIG. 3). In some instances, the vapor phase and/or chemical vapor deposition techniques occur under vacuum conditions. Other known deposition techniques can also be used.

Electron beam physical vapor deposition techniques, a type of vapor phase deposition, can also be used. For example, the step of depositing a transition metal 122 onto a substrate 110 can comprise electron beam physical vapor deposition. In such embodiments, the transition metal 122 or other material can be targeted with an electron beam, causing atoms from the metal or material to transform into the gaseous phase. The gaseous phase atoms can then precipitate into solid form and coat the substrate (e.g., as illustrated in FIG. 1, where the gaseous phase transition metal atoms 122 are coated onto the substrate 110).

In certain embodiments disclosed herein, the step of depositing a transition metal 122 onto a substrate 110 comprises a vapor phase deposition technique. In particular embodiments, the step of depositing the chalcogen 130 onto the epitaxial transition metal layer 120 (detailed below) comprises a chemical vapor deposition technique. And in more particular embodiments, the step of depositing a transition metal 122 onto a substrate 110 comprises a vapor phase deposition technique, and the step of depositing the chalcogen 130 onto the epitaxial transition metal layer 120 comprises a chemical vapor deposition technique.

With continued reference to FIG. 1, various types of substrates 110 can be used in accordance with the methods disclosed herein. Moreover, in some embodiments, the method further comprises a step of obtaining a substrate 110 upon which a transition metal 122 can be deposited. Without limitation, a substrate can refer to any substance or layer upon which another substance is deposited. Illustrative materials that can be included in the substrate 110 include, but are not limited to, aluminum nitride (AlN), gallium nitride (GaN), gallium arsenide (GaAs), titanium dioxide ($TiO_2$), Si (silicon), and aluminum oxide ($Al_2O_3$). Other materials can also be used.

Single layer substrates 110 or multi-layer substrates 110 can be used. For example, as shown in the illustrated embodiment of FIG. 1, the substrate 110 can include a first layer and a second layer. In certain embodiments, the first layer comprises a base layer 112, and the second layer comprises a crystalline layer 114. The thicknesses of the layers 112, 114 can be different, or the thicknesses of the layers 112, 114 can be the same, depending on the substrate 110 that is used.

The base layer 112 of the substrate 110 can comprise various materials, including, but not limited to, silicon and/or aluminum oxide ($Al_2O_3$). The material of the base layer 112 can also be arranged in an ordered or substantially ordered manner, pattern, crystalline, or lattice structure, such as silicon having an orientation or Miller index of (111) (i.e., Si(111)), or c-plane sapphire aluminum oxide ($Al_2O_3$). Other materials and arrangements can also be used.

The crystalline layer 114 can also comprise various materials, including, but not limited to, aluminum nitride (AlN), gallium nitride (GaN), gallium arsenide (GaAs), titanium dioxide ($TiO_2$) and aluminum oxide $Al_2O_3$. Further, in some embodiments, the crystalline layer 114 comprises materials that are arranged in an ordered or substantially ordered manner. For example, the crystalline layer 114 can comprise a selected pattern, crystalline, or lattice structure. In various embodiments, the crystalline layer 114 comprises a material having an orientation or Miller index of (100) or (110), including, but not limited to AlN(100), GaN(100), GaAs (100), and/or $TiO_2$(110). In other of such embodiments, the substrate 110, and/or the crystalline layer 114, comprises c-plane sapphire aluminum oxide ($Al_2O_3$).

The use of a crystalline layer 114 in the substrate 110 can be advantageous in many ways. For example, a crystalline layer 114 having a particular crystalline structure can help facilitate deposition or growth of the transition metal 122 in a desired or selected arrangement and/or lattice structure. In such embodiments, the deposition or growth of the transition metal 122 upon the substrate 110 can be dependent upon the crystalline structure of the crystalline layer 114. As shown in FIG. 1, for example, the surface of the crystalline layer 114 can act as a template for the deposition or growth of the transition metal 122. In other words, the crystalline layer 114 can cause the transition metal 122 deposited thereon to grow (or otherwise be deposited) in an arranged manner or pattern, resulting in an epitaxial transition metal layer 120 having a particular crystalline or lattice structure. Further, the crystalline structure or arrangement of the epitaxial transition metal layer 120 can be predetermined and selected depending on the structure (which can be known) of the underlying crystalline layer 114 of the substrate 110.

The epitaxial transition metal layer 120 can also be referred to as an epitaxial layer or epitaxial overlayer 120, and the deposition process can be referred to as an epitaxial growth process. As detailed below, the ordered or substantially ordered arrangement of the transition metal atoms 122 in the epitaxial transition metal layer 120 can be advantageous and/or optimized for further processing steps. For example, the reaction temperatures for further processing steps (e.g., steps of reacting a chalcogen with the epitaxial transition metal layer) can be relatively lower (e.g., lower than previously known manufacturing methods) when an epitaxial transition metal layer 120 comprises a specific epitaxy or ordered arrangement.

After a substrate 110 has been obtained, selected, and/or produced, a transition metal 122 can be deposited thereon. Various types of transition metals 122 can be used, including, but not limited to, molybdenum, tungsten, and tantalum. Other transition metals can also be used. As previously discussed, in some embodiments, the transition metal 122 is deposited onto the substrate 110 to form an epitaxial transition metal layer 120 using vapor phase deposition techniques (e.g., electron beam physical vapor deposition).

In some embodiments, the epitaxial transition metal layer 120 comprises a selected arrangement, crystalline and/or lattice structure. For example, in some embodiments, the epitaxial transition metal layer 120 comprises a hexagonal crystalline and/or lattice structure (e.g., a two-dimensional or 2D hexagonal crystalline and/or lattice structure). In certain embodiments, the epitaxial transition metal layer 120 comprises an orientation or Miller index of (111). And in particular embodiments, the epitaxial transition metal layer 120 comprises molybdenum (111).

The transition metal 122 can be deposited to form a single monolayer, or several monolayers, which can be referred to as a single epitaxial monolayer or an epitaxial layer with several monolayers, respectively. In particular embodiments, the epitaxial layer comprises between about 1 and 5 monolayers, 1 and 4 monolayers, 1 and 3 monolayers, or 1 and 2 monolayers. In certain embodiments, the thickness of each monolayer can be between about 1 and 5 angstroms (with a 5 monolayer structure being between about 5 and 25 angstroms). Structures having greater thicknesses (or lesser thicknesses) can also be made.

After a sufficient amount of transition metal 122 has been deposited on the substrate 110 to form an epitaxial transition metal layer 120, a step of depositing a chalcogen 130 onto the epitaxial transition metal layer 120 can be performed, as shown in FIG. 2. Illustrative chalcogens 130 that can be used include, but are not limited to, sulfur (S or $S_2$) and selenium (Se). Other chalcogens 130 can also be used.

As discussed above, in some embodiments, the chalcogen 130 is deposited onto the epitaxial transition metal layer 120 using chemical vapor deposition techniques. Further, in particular embodiments, a portion of the chalcogens 130 diffuse or otherwise move through the epitaxial transition metal layer 120. As part of the chemical vapor deposition process (or independent thereof), the chalcogens 130 can also react, be reacted with, or otherwise interact with the epitaxial transition metal layer 120 to form one or more transition metal dichalcogenide monolayers.

In some embodiments, reacting the chalcogens 130 with the epitaxial transition metal layer 120 is performed at elevated temperatures. For example, the reaction temperature can be between about 300° C. and 600° C., between about 300° C. and 550° C., between about 300° C. and 500° C., between about 300° C. and 450° C., or between about 300° C. and 400° C. Further, in some embodiments, the reaction temperature is less than about 600° C., less than about 550° C., less than about 500° C., less than about 450° C., less than about 400° C., or less than about 350° C. The resulting transition metal dichalcogenide monolayer can then be cooled, and in some instances, removed from the substrate 110 and used in various ways. Exemplary uses include use in microelectronics, optoelectronics, and bio/chemical sensing (e.g., bio-sensing, chemical sensing, gas sensing, etc.).

An exemplary transition metal dichalcogenide 140 formed in accordance with the methods disclosed herein is depicted in FIG. 3. As shown therein, a portion of the chalcogens 130 have diffused through the previously prepared epitaxial transition metal layer 120, and the resulting transition metal dichalcogenide 140 monolayer comprises a single layer of transition metal 122 sandwiched between two layers of chalcogens 130. Such a transition metal dichalcogenide 140 can be referred to as a monolayer or two-dimensional transition metal dichalcogenide 140. In further embodiments, multiple monolayers of transition metal dichalcogenide 140 can be formed (e.g., such as when multiple layers of transition metals are disposed on the substrate), each of which can comprise a single layer of transition metal 122 sandwiched between two layers of chalcogen 130. For example, the transition metal dichalcogenide 140 can comprise between about 1 and 5 monolayers, 1 and 4 monolayers, 1 and 3 monolayers, or 1 and 2 monolayers. In certain embodiments, the thickness of each transition metal dichalcogenide monolayer 140 can be between about 0.1 and 1.5 nm.

Various types of transition metal dichalcogenides 140 can be formed in accordance with the methods disclosed herein. Illustrative transition metal dichalcogenides include, but are not limited to, molybdenum disulfide ($MoS_2$) and tungsten diselenide ($WSe_2$). The transition metal dichalcogenides formed in accordance with the methods disclosed herein can also comprise a two-dimensional or 2D hexagonal structure, which can have a relatively broad electronic bandgap and can be useful in a variety of technologies.

As can be appreciated, one or more additional manufacturing steps and/or processes can also be employed with the methods disclosed herein. For example, in certain embodiments, the methods further comprise a step of heating the chalcogen 130. For example, the chalcogen 130 can be heated prior to being deposited onto the epitaxial transition metal layer 120. In some of such embodiments, the chalcogen 130 can be heated to a temperature of at least about 100° C., 150° C., or 200° C., or more. The heated chalcogen 130 can then be delivered to and deposited onto the epitaxial transition metal layer 120. In some embodiments, heating the chalcogen 130 can aid in providing a chalcogen 130 vapor that is deposited onto and/or reacted with the epitaxial transition metal layer 120.

In further embodiments, one or more carrier gases can also be used to aid in delivering the chalcogen 130 to the epitaxial transition metal layer 120. For example, in some embodiments, an inert gas is used to deliver the chalcogen 130 to the epitaxial transition metal layer 120. Exemplary carrier gases that can be used include, but are not limited to, argon and other inert gases.

Additional steps and/or processes employed in the lithographic patterning and/or etching arts can also be used. For example, in some embodiments a portion of the substrate 110 can be masked or otherwise processed to control the spatial placement and registry of the transition metal 122 on the substrate 110.

The growth or deposition of the transition metal 122 on the substrate 110 can also be monitored. For example, in certain embodiments, the growth of the epitaxial transition metal layer 120 can be monitored with an oscillator, or a microbalance oscillator, which can measure the thickness of the growth layer. Monitoring such thicknesses can aid in making an epitaxial transition metal layer 120 having a desired number of monolayers (e.g., between 1 and 5, 1 and 4, 1 and 3, or 1 and 2). Other known manufacturing techniques (e.g., semiconductor manufacturing techniques) and steps can also be used.

Figure 4:
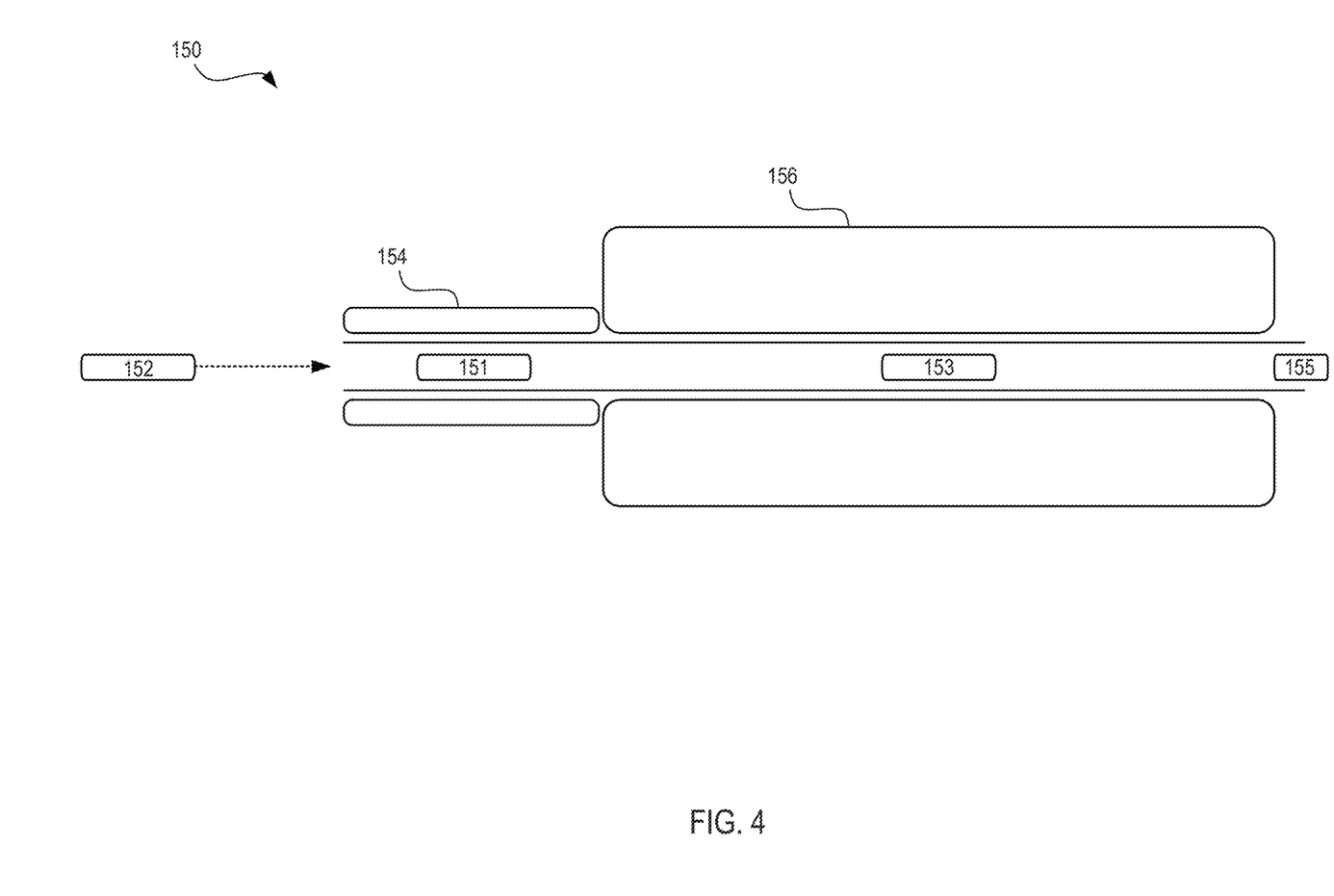
FIG. 4 is a schematic illustration of a system for making a transition metal dichalcogenide in accordance with an embodiment of the present disclosure.

FIG. 4 depicts an illustrative system 150 for making a transition metal dichalcogenide semiconductor structure in accordance with the embodiments of the present disclosure. As shown in FIG. 4, a carrier gas 152 can be delivered into the reaction system 150, as indicated by the reference arrow. In some embodiments, the carrier gas 152 is delivered into a first chamber or furnace 154 comprising a chalcogen 151. In some of such embodiments, the first chamber 154 is maintained at a temperature of at least about 100° C., 150° C., or 200° C., which can be sufficient to heat the chalcogen 151 and produce a vapor for reacting with the epitaxial transition metal layer.

The carrier gas 152 and heated chalcogen 151 can then be delivered into a second chamber or furnace 156 containing one or more processed substrates 153 that have been coated with an epitaxial transition metal layer, as described herein. The second chamber or furnace 156 can also be referred to as a reaction chamber. In certain embodiments, the temperature of the second chamber 156 can be between about 300° C. and 600° C., between about 300° C. and 550° C., between about 300° C. and 500° C., between about 300° C. and 450° C., or between about 300° C. and 400° C. In other embodiments, the temperature of the second chamber 156 is less than about 600° C., less than about 550° C., less than about 500° C., less than about 450° C., less than about 400° C., or less than about 350° C. A chalcogen trap (e.g., a sulfur trap) 155 can also be used to capture excess chalcogen flowing through the second chamber 156. As also shown in FIG. 4, the temperatures of the first and second chambers 154, 156 can be controlled independently.

After a period of time (e.g., 10 minutes, 20 minutes, 30 minutes, etc.), the length of which can be dependent upon various reaction factors (e.g., the concentration of the chalcogen 151, the number of monolayers in the epitaxial transition metal layer, the surface area of the epitaxial transition metal layer, etc.), the process can be terminated, the chambers 154 and/or 156 cooled, and/or the resulting transition metal dichalcogenide can be removed from the system 150. The transition metal dichalcogenides can then be further processed (e.g., removed from the substrate 153) or otherwise used as desired.

EXAMPLES

The following examples are illustrative of embodiments of the present disclosure, as described above, and are not meant to be limiting in any way.

Example 1

A substrate was obtained having a c-axis oriented aluminum nitride (AlN(100)) crystalline layer and a silicon (Si (111)) base layer. The thickness of the AlN(100) crystalline layer was about 200nm. Molybdenum was then deposited on the crystalline layer of the substrate by electron beam physical vapor deposition techniques under vacuum conditions to form an epitaxial molybdenum layer of Mo(111). The processed substrate, including the epitaxial molybdenum layer, was then placed in a reaction chamber for further processing.

Figure 5:
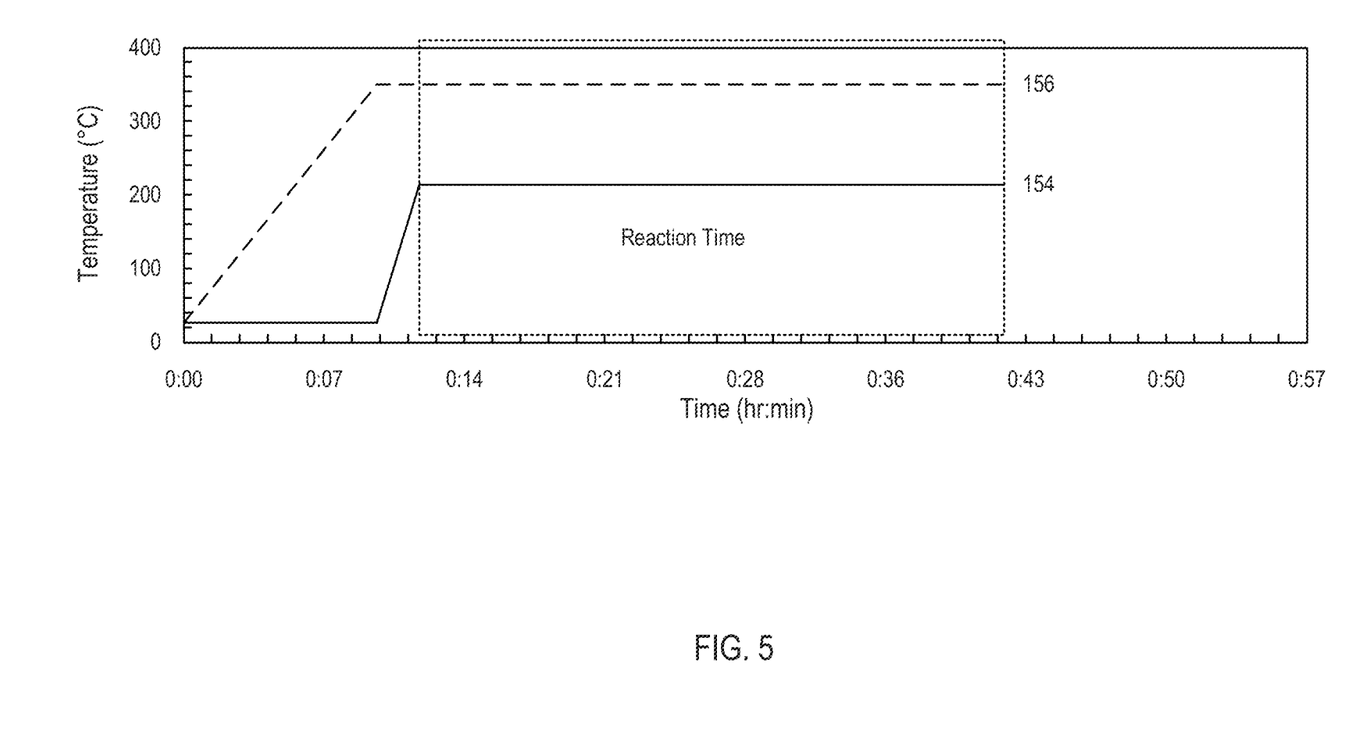
FIG. 5 is a graph of the temperature profile of an illustrative method of making a transition metal dichalcogenide in accordance with an embodiment of the present disclosure.

The reaction chamber was heated and maintained at a temperature of between about 300° C. and 400° C. throughout the reaction process. Sulfur, heated to a temperature of between about 200° C. and 250° C., was then continuously delivered to the reaction chamber using an argon carrier gas for a period of about 30 minutes while the sulfur reacted with the epitaxial molybdenum layer of Mo(111) to form a molybdenum disulfide transition metal dichalcogenide. The process was then terminated, and the reaction chamber was allowed to cool. A graph of the reaction temperature and sulfur temperature versus the reaction time is shown in FIG. 5, where the temperature of the reaction chamber is depicted by the line 156, and the temperature of the sulfur source is depicted by the line 154.

Example 2

Figure 6:
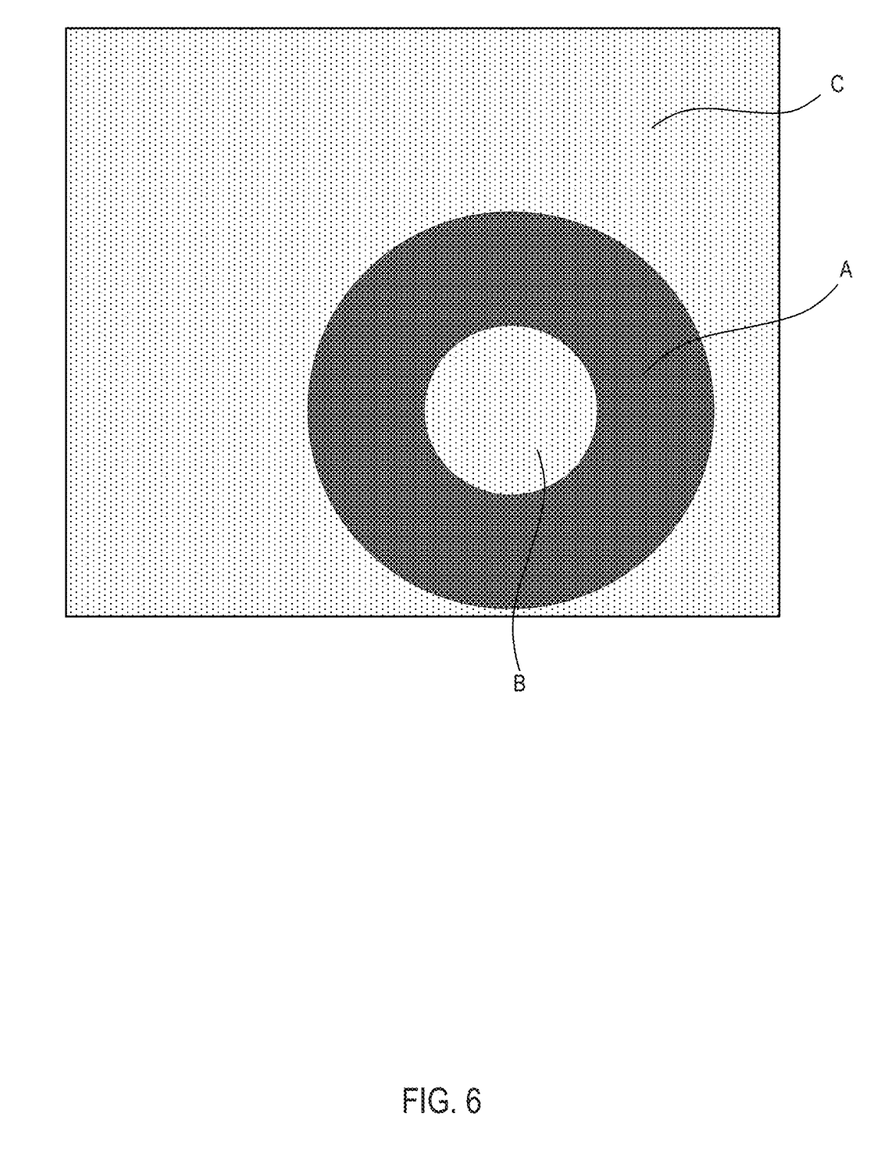
FIG. 6 is a plan view of a schematic illustration of a transition metal dichalcogenide made in accordance with the present disclosure.

A molybdenum disulfide transition metal dichalcogenide made in accordance with the methods disclosed herein was prepared using a method similar to that disclosed in Example 1. Molybdenum was used as the transition metal, and sulfur was used as the chalcogen. The reaction temperature for reacting the sulfur and the epitaxial molybdenum layer was about 400° C. Further, as a control, a portion of the substrate was masked and covered prior to depositing the molybdenum onto the substrate. A schematic plan view depicting the resulting molybdenum disulfide is depicted in FIG. 6, where section A represents the masked surface, and sections B and C represent the unmasked surfaces that resulted in molybdenum disulfide.

Figure 7:
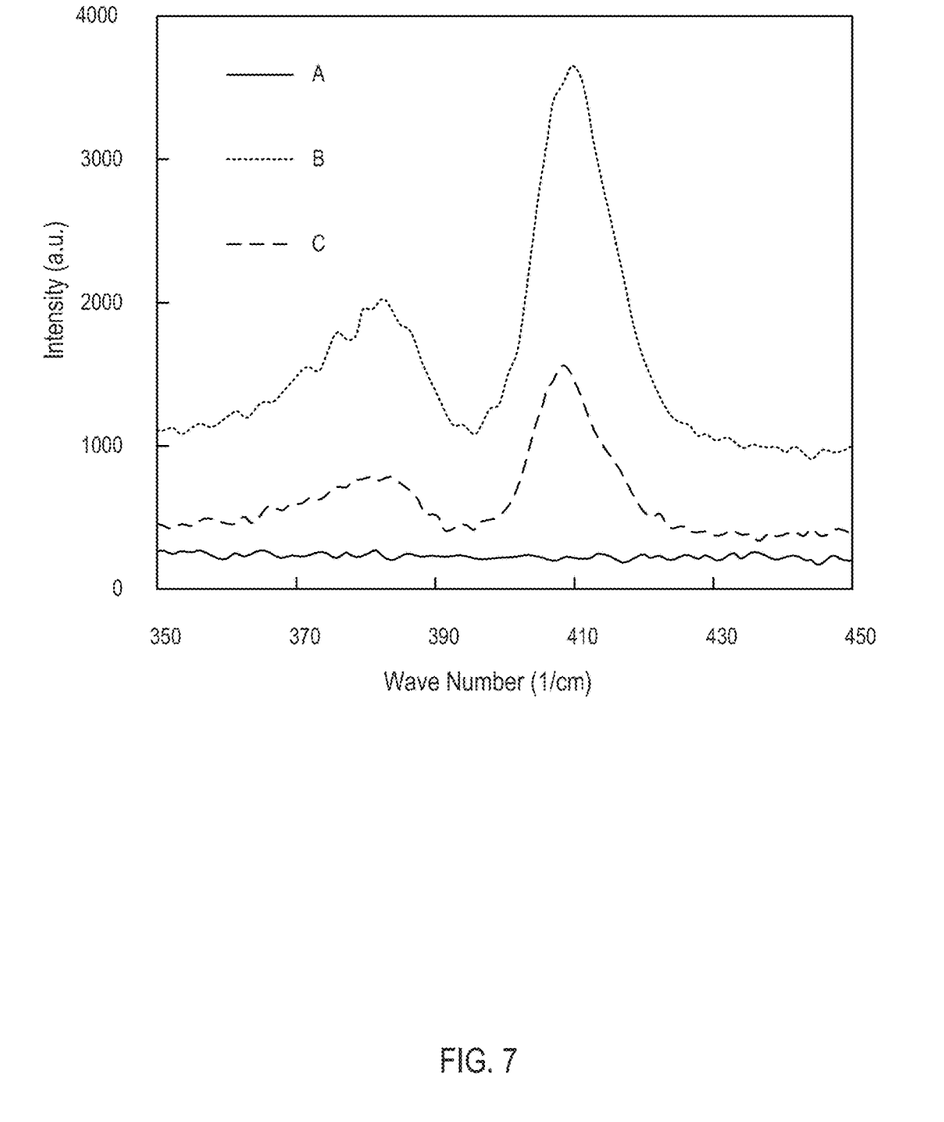
FIG. 7 is a graph of the Raman spectroscopy of the transition metal dichalcogenide depicted in FIG. 6.

Raman spectroscopy was used to analyze the resulting molybdenum disulfide structure, a graph of which is depicted in FIG. 7. As shown in FIG. 7, it was observed that the molybdenum throughout the non-masked portions (regions B and C) had reacted with the sulfur and converted to molybdenum disulfide ($MoS_2$). This was evident by the peaks in the Raman spectra located around 385 $cm^{-1}$ and 410 $cm^{-1}$, which are associated with the molybdenum disulfide ($MoS_2$) from the B and C regions (note that the intensity of the Raman measurement for B was enhanced, as compared to C, for clarity purposes). In contrast, no such peaks were exhibited in the Raman spectra of the masked region A. The masked versus unmasked portions were also visible on the substrate. Accordingly, the method resulted in the successful formation of a molybdenum disulfide monolayer at a reaction temperature of between about 300° C. and 600° C.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment. Additionally, references to ranges include both endpoints.

Similarly, it should be appreciated that in the above description of embodiments, various features are sometimes grouped together in a single embodiment, figure, or description thereof for the purpose of streamlining the disclosure.

This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of making a transition metal dichalcogenide, comprising:
   depositing a transition metal onto a substrate to form an epitaxial transition metal layer;
   depositing a chalcogen onto the epitaxial transition metal layer by chemical vapor deposition; and
   reacting the chalcogen with the epitaxial transition metal layer to form a transition metal dichalcogenide;
   wherein the step of reacting the chalcogen with the epitaxial transition metal layer is performed at a temperature of between about 300° C. and 550° C.

2. The method of claim 1, wherein the step of depositing a transition metal onto a substrate comprises vapor phase deposition.

3. The method of claim 1, wherein the substrate comprises at least one of aluminum oxide ($Al_2O_3$), aluminum nitride (AlN), gallium nitride (GaN), gallium arsenide (GaAs), or titanium dioxide ($TiO_2$).

4. The method of claim 1, wherein the substrate comprises a crystalline layer.

5. The method of claim 4, wherein the crystalline layer comprises a material having a Miller index of (100) or (110).

6. The method of claim 4, wherein the crystalline substrate comprises at least one of AlN(100), GaN(100), GaAs (100), or $TiO_2$(110).

7. The method of claim 4, wherein the substrate further comprises a base layer, wherein the crystalline layer is disposed on the base layer.

8. The method of claim 7, wherein the base layer comprises at least one of silicon or aluminum oxide ($Al_2O_3$).

9. The method of claim 8, wherein the silicon has a Miller index of (111).

10. The method of claim 1, wherein the transition metal comprises at least one of molybdenum, tungsten, or tantalum.

11. The method of claim 1, wherein the chalcogen comprises at least one of sulfur or selenium.

12. The method of claim 1, wherein the transition metal dichalcogenide comprises molybdenum disulfide or tungsten diselenide.

13. The method of claim 1, wherein the epitaxial transition metal layer comprises a monolayer.

14. The method of claim 1, wherein the epitaxial transition metal layer comprises between 1 and 5 monolayers.

15. The method of claim 1, wherein the transition metal dichalcogenide comprises between 1 and 5 monolayers.

16. The method of claim 1, further comprising:
    heating the chalcogen, wherein the step of heating the chalcogen is performed before the step of depositing the chalcogen onto the epitaxial transition metal layer.

17. The method of claim 16, wherein the chalcogen is heated to a temperature of at least about 200° C. to produce a vapor for reacting with the epitaxial transition metal layer.

18. The method of claim 1, wherein a carrier gas is used to deliver the chalcogen to the epitaxial transition metal layer.

19. The method of claim 18, wherein the carrier gas comprises an inert gas.

20. The method of claim 18, wherein the carrier gas comprises argon.

21. The method of claim 1, further comprising:
    monitoring growth of the epitaxial transition metal layer.

22. The method of claim 21, wherein the step of monitoring growth of the epitaxial transition metal layer comprises measuring the thickness of the epitaxial transition metal layer with an oscillator.

23. A method of making a transition metal dichalcogenide, comprising:
    depositing a transition metal onto a substrate to form an epitaxial transition metal layer;
    delivering a chalcogen into a reaction chamber containing the epitaxial transition metal layer;
    depositing the chalcogen onto the epitaxial transition metal layer by chemical vapor deposition; and
    reacting the chalcogen with the epitaxial transition metal layer, wherein the chalcogen is reacted with the epitaxial transition metal layer at a temperature sufficient to cause the formation of a transition metal dichalcogenide, wherein the temperature is less than about 600° C.

24. The method of claim 23, wherein the substrate comprises a crystalline layer.

25. The method of claim 24, wherein the crystalline layer comprises a material having a Miller index of (100) or (110).

26. The method of claim 24, wherein the crystalline substrate comprises at least one of AlN(100), GaN(100), GaAs(100), or $TiO_2$(110).

27. The method of claim 23, wherein the step of reacting the chalcogen with the epitaxial transition metal layer is performed at a temperature of between about 300° C. and 550° C.

28. The method of claim 23, further comprising:
    heating the chalcogen, where the step of heating the chalcogen is performed before the step of delivering the chalcogen into the reaction chamber.

29. The method of claim 28, wherein the chalcogen is heated to a temperature of at least about 200° C. to produce a vapor for reacting with the epitaxial transition metal layer.

30. A method of making a transition metal dichalcogenide, comprising:
    depositing at least one of molybdenum, tungsten, or tantalum onto a substrate to form an epitaxial transition metal layer, wherein the substrate comprises a crystalline layer;
    heating a chalcogen, wherein the chalcogen comprises at least one of sulfur or selenium;
    depositing the chalcogen onto the epitaxial transition metal layer by chemical vapor deposition; and
    reacting the chalcogen with the epitaxial transition metal layer at a temperature of between about 300° C. and 600° C. to form a transition metal dichalcogenide.

31. The method of claim 30, wherein the crystalline layer comprises a material having a Miller index of (100) or (110).

32. The method of claim 30, wherein the crystalline substrate comprises at least one of AlN(100), GaN(100), GaAs(100), or TiO$_2$(110).

33. The method of claim 30, wherein the step of reacting the chalcogen with the epitaxial transition metal layer is performed at a temperature of between about 300° C. and 500° C.

34. The method of claim 30, wherein the chalcogen is heated to a temperature of at least about 200° C. to produce a vapor for reacting with the epitaxial transition metal layer.

* * * * *